United States Patent [19]
Kim et al.

[11] Patent Number: 5,025,180
[45] Date of Patent: Jun. 18, 1991

[54] TTL TO ECL VOLTAGE LEVEL TRANSLATOR

[75] Inventors: Heung S. Kim, Inchon; Chan K. Myung, Seoul, both of Rep. of Korea

[73] Assignee: SamSung Semiconductor and Telecommunication Co. Ltd., Gumi, Rep. of Korea

[21] Appl. No.: 215,294

[22] Filed: Jul. 5, 1988

[30] Foreign Application Priority Data

Jul. 7, 1987 [KR] Rep. of Korea .................. 87-7260

[51] Int. Cl.$^5$ ................ H03K 19/092; H03K 19/086
[52] U.S. Cl. .................................. 307/475; 307/455; 307/456
[58] Field of Search .................... 307/475, 455, 456

[56] References Cited

U.S. PATENT DOCUMENTS

| | | | |
|---|---|---|---|
| 4,518,876 | 5/1985 | Constantinescu | 307/475 |
| 4,607,177 | 8/1986 | Lechner | 307/475 |
| 4,654,549 | 3/1987 | Hannington | 307/475 |
| 4,698,527 | 10/1987 | Matsumoto | 307/475 |
| 4,700,087 | 10/1987 | Stroberger | 307/455 |
| 4,806,800 | 2/1989 | Khan | 307/475 |

OTHER PUBLICATIONS

"Analysis and Design of Digital Integrated Circuits", by David A. Hodges et al., McGraw-Hill, 1983, pp. 293-295.

Primary Examiner—Stanley D. Miller
Assistant Examiner—Richard Roseen
Attorney, Agent, or Firm—Cushman, Darby & Cushman

[57] ABSTRACT

The present invention relates to a level translator which translates TTL level signals to ECL level. The translating speed is enhanced by making the input circuit of the level translator which receives the TTL data signal composed of an emitter coupled pair such that the circuit does not act in saturation mode. Also, by designing the circuit to make current flow from the pull-up transistor of the TTL transfer through the resistance of the present invention when the TTL data is high level, and to make current flow through the pull-down transistor of the driving TTL circuit into the TTL to ECL level translator when low level, the present invention makes the time delay from the driving TTL circuit to the ECL receiving circuit very small.

7 Claims, 3 Drawing Sheets

TTL TO ECL VOLTAGE LEVEL TRANSLATOR

BACKGROUND OF THE INVENTION

1. Field of the Invention

The present invention relates to a voltage level translator, which especially enhanced the speed of level translating by constituting the circuit not to make the transistor saturated in translating the TTL(Transistor-Transistor Logic) level ECL (Emitter-Coupled Logic) level.

2. Description of the Prior Art

In the Integrated Circuit of high-speed performance over LSI( Large Scale Integrated Circuit),the ECL circuit, of which the speed is high, is frequently used.

But the general outer circuit of the system is composed of TTL in many cases.

Like this, When the outer logic of the system is composed of TTL and the inner logic of the Integrated Circuit is composed of ECL, a translator which translates the TTL level to the ECL level (hereinafter referred to as TTL to ECL level translator) is indispensible and has been introduced many times up to now, but the time in translating the level has always been the problem.

Generally, the traditional TTL to ECL level translator uses the TTL input circuit as shown in FIG. 2 or DTL(Diode-Transistor-Logic) input circuit as shown in FIG. 3.

But the DTL input circuit is generally slower than TTL, and in the TTL input circuit as shown in FIG. 2, there has been the problem that the speed of data processing is lowered because of the phenomenon of the transistor $Q_1$ being saturated.

SUMMARY OF THE INVENTION

The object of the present invention is to provide the TTL to ECL translator with high speed which can improve the abovementioned problem.

To accomplish the said object, The translating speed of level translator is made to become higher by designing the input circuit part of the TTL to ECL level translator to be composed of emitter coupled pair

BRIEF DESCRIPTION OF THE DRAWINGS

The present invention will become more fully understood from the detailed description given hereinbelow and the accompanying drawings which are given by way of illustration only, and thus are not limitative of the present, and wherein.

THE DETAILED DESCRIPTION OF THE INVENTION

Figure 1:
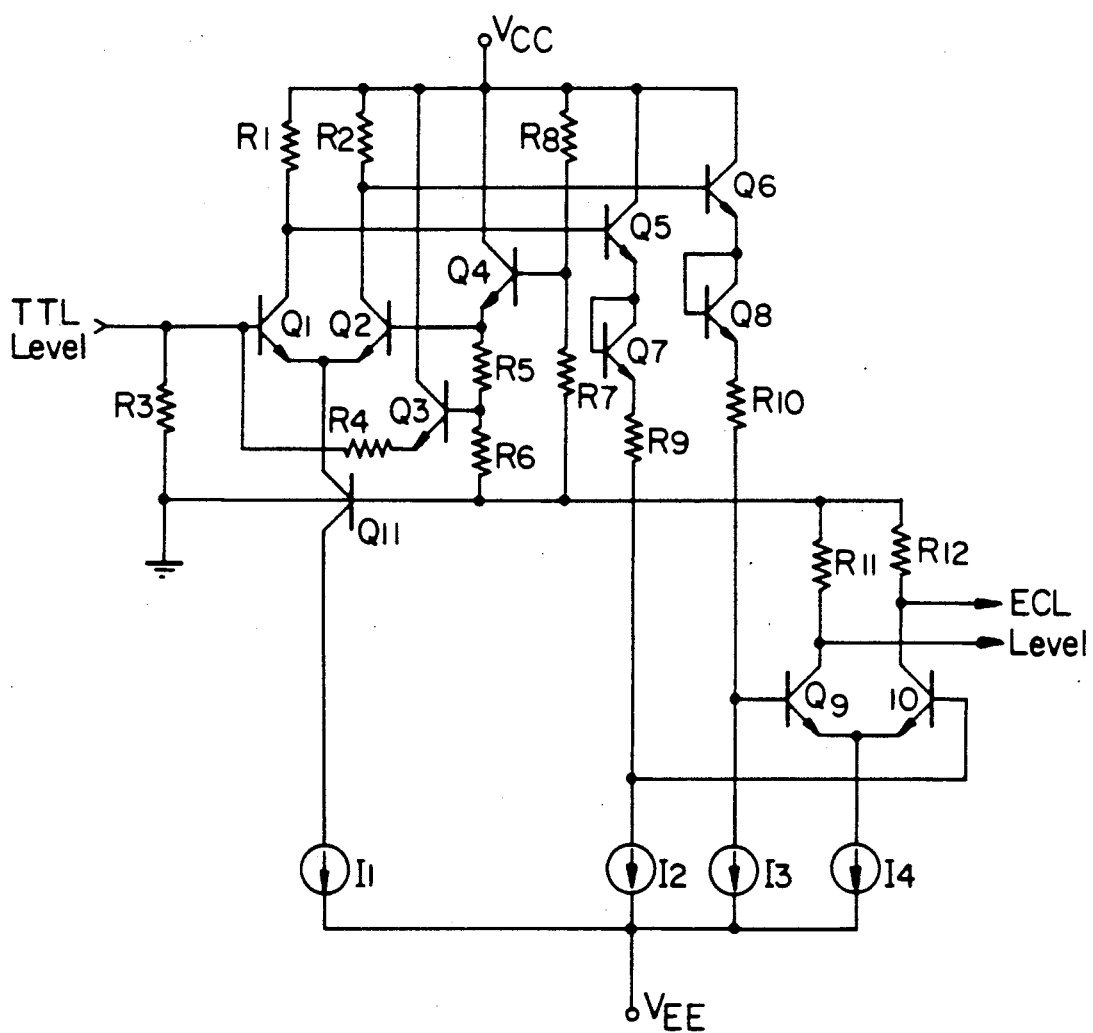
FIG. 1 is a circuit diagram of the present invention.
Figure 2:
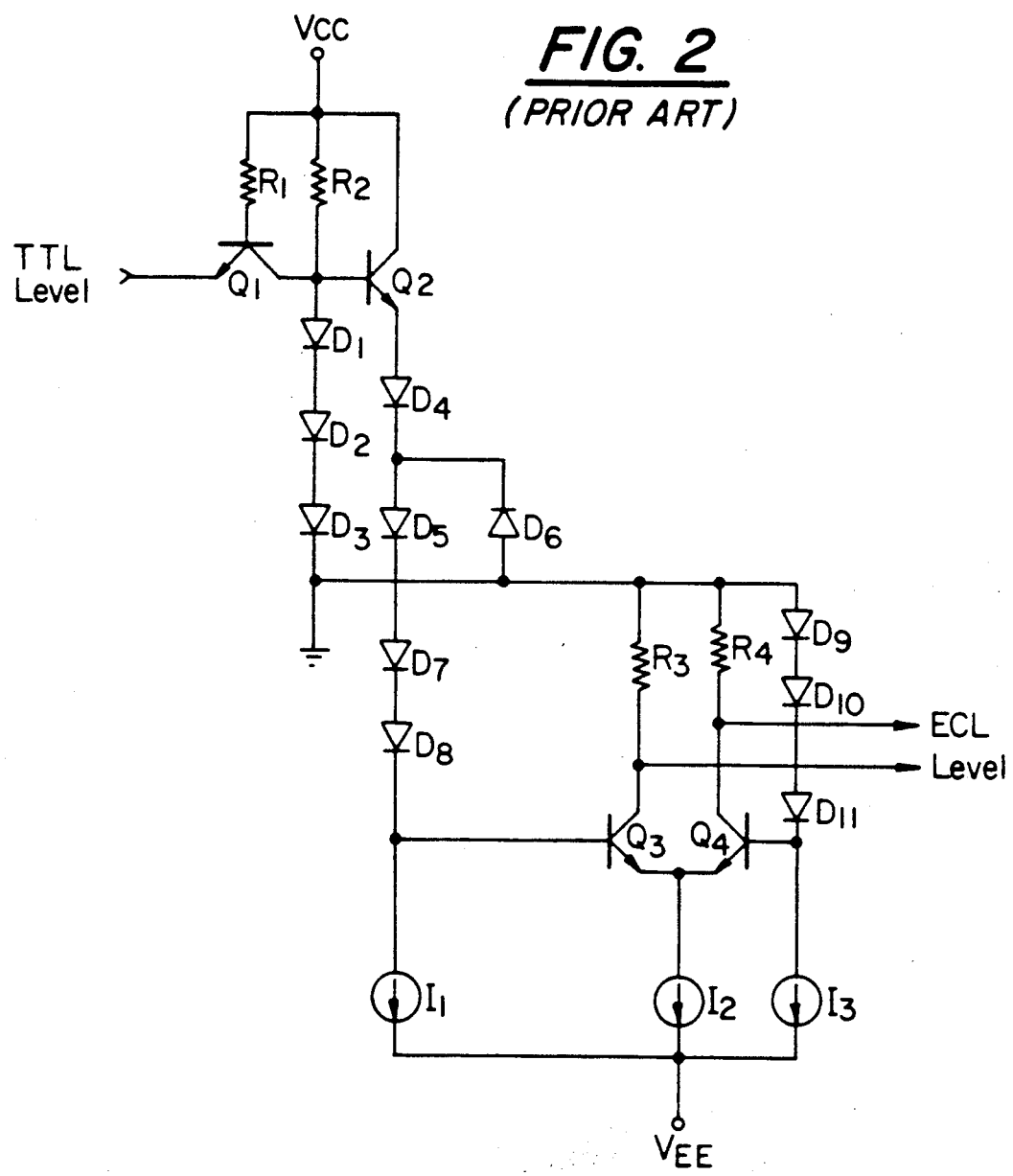
FIG. 2 and 3 are the traditional circuit diagram.
Figure 3:
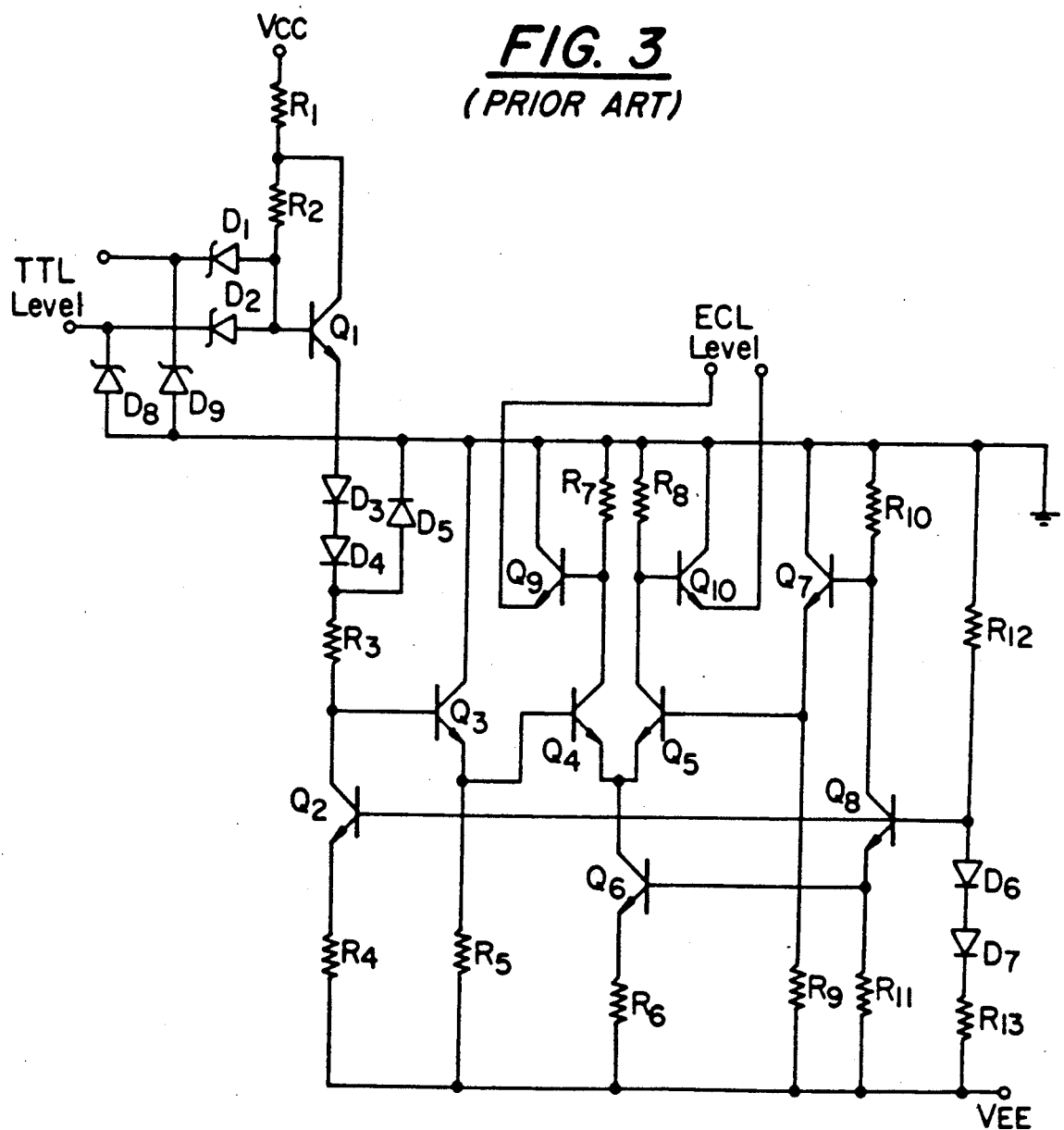

The input circuit part of the TTL to ECL level translator of the present invention is composed of transistors $Q_1$, $Q_2$ and resistances $R_1$, $R_2$ as the emitter coupled pair.

The base of the transistor $Q_1$, to which the input signal of the TTL data is applied, is grounded through the resistance $R_3$, and emitter of the transistor $Q_3$ is connected to the base of the transistor $Q_1$ through the resistance $R_4$.

The resistances $R_5$, $R_6$ and the transistor $Q_4$ are activating for the bias of the transistors $Q_2$, $Q_3$.

And for the bias of the transistor $Q_4$, the biasing voltage from the divided voltage by the resistances $R_7$ and $R_8$ is applied to the base of the transistor $Q_4$.

Each collector signal of the transistors $Q_1$ and $Q_2$ is transferred to the bases of transistors $Q_9$ and $Q_{10}$ which are composed of emitter coupled pair and are operated in the output circuit of the voltage level shifter, by way of voltage-level-transfer circuit which is composed of the transistors $Q_5$–$Q_8$, the resistances $R_9$ and $R_{10}$ and the current sources $I_2$ and $I_3$, and so the signals of the ECL level are supplied at the collectors of the transistors $Q_9$ and $Q_{10}$ respectively.

In operation, the input data of the TTL level is inputed to the base of the transistor $Q_1$, and the middle level of the high and low level of the TTL level is applied to the base of the transistor $Q_2$.

When the TTL level inputed from the outer driving TTL circuit is high, the current flows from the Pull-up element of the outer TTL circuit through the resistance $R_3$, and when the TTL level inputed is low, the current flows into the active pull-down transistor of outer TTL circuit through the transistor $Q_3$ and resistance $R_4$.

And the TTL level inputed to the transistor $Q_1$ is compared with the middle level applied to the base of the transistor $Q_2$, and then changed to the level of inner voltage which is divided by the current source $I_1$ and each resistance $R_1$ and $R_2$.

And so it is applied to the bases of transistors $Q_9$ and $Q_{10}$ by way of voltage-level-shifter circuit composed of the transistors $Q_5$–$Q_8$, the resistances $R_9$ and $R_{10}$ and the current source $I_2$ and $I_3$.

And then the signal of the ECL level, which is determined by the resistances $R_{11}$ and $R_{12}$ and the current source $I_4$, is outputted to each collector of the transistor $Q_9$ and $Q_{10}$, and inputed to the ECL circuit of the LSI.

As mentioned above, according to the circuit of the present invention the translation speed is enhanced because any transistor in the circuit is not saturated by designing the input circuit part, which receives the data of the TTL level, to be emitter coupled pair.

And also there is the advantage that it can increase the speed of the outer driving TTL circuit by making the path which makes the current flow from the pull-up element of the TTL circuit which is driving through the resistance $R_3$ when the data of the level inputed is high level, and which makes the current flow through the transistor $Q_3$ and the resistance $R_4$ to the pull-down transistor of the outer TTL circuit which is driving, when low level.

We claim:

1. A TTL to ECL signal translator circuit for interfacing between a TTL transfer-circuit and an ECL receive-circuit to translate a transfer-circuit signal, which varies between a first TTL input voltage level and a second TTL input voltage level, into an ECL level signal, which varies between a first ECL output voltage level and a second ECL output voltage level, which is compatible with said ECL receive-circuit, the circuit comprising:

reference voltage means for providing a reference voltage at a level between said first TTL input voltage level and said second TTL voltage level;

comparator means for comparing said reference voltage to said transfer-circuit signal and for generating a comparison signal which corresponds to said comparison;

voltage level shift means for converting said comparison signal into a level shifted signal varying between a first voltage level and a second voltage level wherein said level shifted signal is in phase with said transfer-circuit signal; and active pull down means, operatively coupled to said reference voltage means, for selectively injecting current into said transfer-circuit when the transfer-circuit signal voltage level is the lower of said first TTL input voltage level or said second TTL input voltage level.

2. A signal level translator circuit according to claim 1 wherein said reference voltage means further comprises a first resistor and a second resistor connected in series between a power supply and ground, and a transistor, a collector of said transistor being connected to a power supply, and the base of said transistor being connected between said first resistor and second resistor, and a third resistor and fourth resistor being connected in series between an emitter of said transistor and ground.

3. A signal translator circuit according to claim 1 wherein said comparator means further comprises a pair of emitter-coupled transistors.

4. A signal translator circuit according to claim 3 wherein said voltage level-shift means further comprises dual level-shift circuits connected in parallel between a power supply and ground, each comprising a first transistor which is biased by the output of said comparator means and a second base-collector-shorted transistor connected to an emitter of said first transistor, and a resistor connected to an emitter of said second base-collector-shorted transistor.

5. A signal translator circuit according to claim 1 wherein said active pull-down means further comprises a transistor, and a first resistor, and second resistor connected in series between an emitter of said transistor and ground, wherein a collector of said transistor is connected to a power supply and a base biased by the reference voltage means such that a current path exists from the power supply through the transistor and first and second resistors into the transfer-circuit only when the transfer-circuit signal voltage level is a logic zero.

6. A high-speed low-power TTL to ECL signal translator circuit for interfacing between a TTL transfer-circuit and an ECL receive-circuit to translate a transfer-circuit signal, which varies between a first TTL input voltage level and a second TTL input voltage level, into an ECL level signal, which varies between a first ECL output voltage level and a second ECL output voltage level, which is compatible with said ECL receive-circuit, the circuit comprising:

reference voltage means for providing a reference voltage at a level between said first TTL input voltage and said second TTL input voltage level;

comparator means for comparing said reference voltage to said transfer-circuit signal and for generating a comparison signal which corresponds to said comparison;

voltage level shift means for converting said comparison signal into a level shifted signal varying between a first voltage level and a second voltage level wherein said level shifted signal is in phase with said transfer-circuit signal;

active pull down means, operatively coupled to said reference voltage means, for selectively injecting current into said transfer-circuit when the transfer-circuit signal voltage level is the lower of said first TTL input voltage level or said second TTL input voltage level; and output means for driving the ECL receive-circuit with the level shifted signal outputted from said voltage level shift means.

7. A high-speed low-power TTL to ECL signal translator circuit for interfacing between a TTL transfer-circuit and an ECL receive-circuit to translate a transfer-circuit signal, which varies between a first TTL input voltage level and a second TTL input voltage level, into an ECL level signal, which varies between a first ECL output voltage level and second a second ECL output voltage level, which is compatible with said ECL receive-circuit, the circuit comprising:

reference voltage means for providing a reference voltage at a level between said first TTL input voltage and said second TTL input voltage level;

comparator means for comparing said reference voltage to said transfer-circuit signal and for generating a comparison signal which corresponds to said comparison;

voltage level shift means for converting said comparison signal into a level shifted signal varying between a first voltage level and a second voltage level wherein said level shifted signal is in phase with said transfer-circuit signal;

active pull down means, operatively coupled to said reference voltage means, for selectively injecting current into said transfer-circuit when the transfer-circuit signal voltage level is the lower of said first TTL input voltage level or said second TTL input voltage level; and output means for driving the ECL receive-circuit with the level shifted signal outputted from said voltage level shift means, wherein said output means comprises a pair of emitter coupled transistors.

* * * * *